(12) United States Patent
Gunn, III et al.

(10) Patent No.: US 7,039,258 B2
(45) Date of Patent: May 2, 2006

(54) DISTRIBUTED AMPLIFIER OPTICAL MODULATORS

(75) Inventors: Lawrence C. Gunn, III, Encinitas, CA (US); Roger Koumans, Irvine, CA (US); Bing Li, San Diego, CA (US); Guo Liang Li, San Diego, CA (US); Thierry J. Pinguet, Cardif-By-The-Sea, CA (US)

(73) Assignee: Luxtera, Inc., Carlsbad, CA (US)

( * ) Notice: Subject to any disclaimer, the term of this patent is extended or adjusted under 35 U.S.C. 154(b) by 0 days.

(21) Appl. No.: 10/917,927

(22) Filed: Aug. 13, 2004
(Under 37 CFR 1.47)

(65) Prior Publication Data

US 2005/0036791 A1   Feb. 17, 2005

Related U.S. Application Data

(60) Provisional application No. 60/495,402, filed on Aug. 15, 2003, provisional application No. 60/495,403, filed on Aug. 15, 2003, provisional application No. 60/495,404, filed on Aug. 15, 2003.

(51) Int. Cl.
*G02F 1/025* (2006.01)

(52) U.S. Cl. ........................... 385/1; 385/3; 385/14

(58) Field of Classification Search ............... 385/1–3, 385/14, 27, 39, 40
See application file for complete search history.

(56) References Cited

U.S. PATENT DOCUMENTS

| | | | | |
|---|---|---|---|---|
| 3,827,000 A | * | 7/1974 | Matsushita et al. | 359/259 |
| 5,422,966 A | * | 6/1995 | Gopalakrishnan et al. | 385/2 |
| 6,233,070 B1 | * | 5/2001 | Lu et al. | 359/9 |
| 6,587,256 B1 | * | 7/2003 | Leight et al. | 359/316 |
| 6,763,197 B1 | * | 7/2004 | Hirano et al. | 398/192 |
| 6,882,758 B1 | * | 4/2005 | Betty | 385/9 |
| 2002/0109897 A1 | * | 8/2002 | Mirshekar-Syahkal et al. | 359/245 |
| 2002/0154842 A1 | * | 10/2002 | Betts | 385/2 |
| 2002/0159121 A1 | * | 10/2002 | Spickermann | 359/188 |
| 2003/0101575 A1 | * | 6/2003 | Green et al. | 29/720 |
| 2003/0142384 A1 | * | 7/2003 | Kurebayashi | 359/237 |
| 2003/0227666 A1 | * | 12/2003 | Bridges | 359/321 |
| 2004/0246557 A1 | * | 12/2004 | Lefevre et al. | 359/241 |

* cited by examiner

*Primary Examiner*—Sung Pak
*Assistant Examiner*—Mike Stahl
(74) *Attorney, Agent, or Firm*—Fernandez & Associates, LLP.

(57) ABSTRACT

High speed optical modulators can be made of k modulators connected in series disposed on one of a variety of semiconductor substrates. An electrical signal propagating in a microwave transmission line is tapped off of the transmission line at regular intervals and is amplified by k distributed amplifiers. Each of the outputs of the k distributed amplifiers is connected to a respective one of the k modulators. Distributed amplifier modulators can have much higher modulating speeds than a comparable lumped element modulator, due to the lower capacitance of each of the k modulators. Distributed amplifier modulators can have much higher modulating speeds than a comparable traveling wave modulator, due to the impedance matching provided by the distributed amplifiers.

24 Claims, 4 Drawing Sheets

DISTRIBUTED AMPLIFIER OPTICAL MODULATORS

CROSS-REFERENCE TO RELATED APPLICATIONS

This application claims priority from U.S. Provisional applications No. 60/495,402, No. 60/495,403 and No. 60/495,404 filed Aug. 15, 2003.

FIELD OF THE INVENTION

The present invention relates to optical modulators for use in optoelectronic integrated circuits.

BACKGROUND OF THE INVENTION

Optical fibers have been widely used for the propagation of optical signals, especially to provide high speed communications links. Optical links using fiber optics have many advantages compared to electrical links: large bandwidth, high noise immunity, reduced power dissipation and minimal crosstalk. Fiber optic communications links can operate with carrier frequencies in the THz range. In communications systems where optical fibers are used to transport optical communications signals, various optoelectronic devices are used to control, modify and process the optical signals.

An integrated optical modulator is a key component of an optical communications system. An optical modulator uses an electrical signal to modulate some property of an optical wave, like the phase or the amplitude. A modulated optical wave can be sent on a fiber optic link or processed by other optical or optoelectronic devices.

Integrated optoelectronic devices made of silicon are highly desirable since they can be fabricated in the same foundries used to make VLSI integrated circuits. Optoelectronic devices integrated with their associated electronic circuits can eliminate the need for more expensive hybrid optoelectronic circuits. Optoelectronic devices built using a standard CMOS process have many advantages, such as: high yields, low fabrication costs and continuous process improvements.

Previously fabricated silicon-based PIN diode optical modulators have been designed for integrated silicon waveguides with large cross sectional dimensions on the order of several microns. These large modulators are relatively low speed devices capable of modulation at rates in the tens of megahertz, and such low speed devices are not suitable for use in high speed GHz rate systems.

SUMMARY OF THE INVENTION

High speed optical modulators can be made of k modulators connected in series disposed on one of a variety of semiconductor substrates or wafers. An electrical signal propagating in a microwave transmission line is tapped off of the transmission line at regular intervals and is amplified by k distributed amplifiers. Each of the outputs of the k distributed amplifiers is connected to a respective one of the k modulators. Distributed amplifier modulators can have much higher modulating speeds than a comparable lumped element modulator, due to the lower capacitance of each of the k modulators. Distributed amplifier modulators can have much higher modulating speeds than a comparable traveling wave modulator, due to the impedance matching provided by the distributed amplifiers.

DETAILED DESCRIPTION

Figure 1:
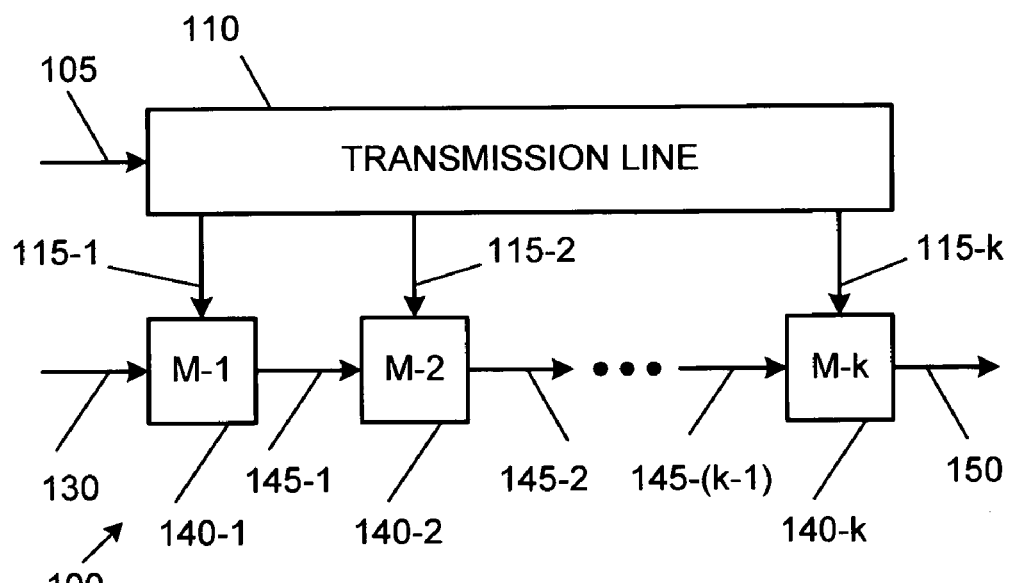
FIG. 1 is a block diagram of a prior art traveling wave integrated optical modulator.

FIG. 1 is a block diagram of a prior art traveling wave (TW) integrated optical modulator. Traveling wave modulator 100 is made of transmission line (TL) 110 and series connected k modulating elements 140-1 to 140-$k$ (M-1 to M-k). TL 110 receives modulating signal 105 at its input port and has k output ports 115-1 to 115-$k$. The output ports 115-1 to 115-$k$ can be equally spaced apart along the length of TL 110, which would correspond to equal amounts of delay between the output ports. The distribution of ports along the length of TL 110 can follow some other distribution. Each of the outputs 115-$j$ is delayed relative to the previous output 115-($j$–1), depending on the length of the transmission line between any two adjacent output ports. Each of the k outputs is connected to the modulating input terminals of the respective k optical modulating elements 140-1 to 140-$k$ connected in series.

Optical carrier 130 is connected to the carrier input of the first modulator 140-1. The modulated output 150 of the series of modulating elements is at the end of the chain of modulators, at the output of modulating element 140-$k$. Optical wave 130 is first modulated by electrical signal 115-1 from transmission line 110 in modulating element M-1 (140-1). Output 145-1 of modulating element 140-1 is connected to the input of modulating element M-2 (140-2), where the optical wave is further modulated by electrical signal 115-2 from transmission line 110. Each successive modulating element in the series can provide additional modulation. This process continues through the k stages of modulation, until the fully modulated output 150 of the last modulating element M-k (140-$k$) is generated.

The velocity of the electrical wave propagating in the transmission line 110 is typically faster than the optical wave propagating in the series of modulating elements 140. In order to match the overall electrical velocity in the TL 110 to the average optical velocity in the series of modulators, TL 110 is designed to have sufficient delay between the output ports to slow down the overall electrical signal to match the speed of the optical signal in the series of modulators.

A TW modulator can be equivalent to a lumped element modulator, where the total capacitance of the series connected modulating elements is equal to the capacitance of the lumped element modulator. A traveling wave modulator can be capable of faster operation as compared to an equivalent lumped element modulator, because the capacitance of each of the individual k modulating elements is 1/k of the capacitance of a lumped element modulator.

Among the disadvantages of a TW modulator is the poor impedance match between the outputs of the transmission line (TL) and the electrical inputs of the optical modulators. Another disadvantage is that the amplitude of the electrical signal in the TL tends to be attenuated as it travels through the TL. As a result, the amplitude of the electrical output signals towards the end of the TL are also attenuated and this means that the optical wave propagating through the modulators at the end of the series of modulators, receives less modulation than it did at the start of the series of modulators.

Figure 2:
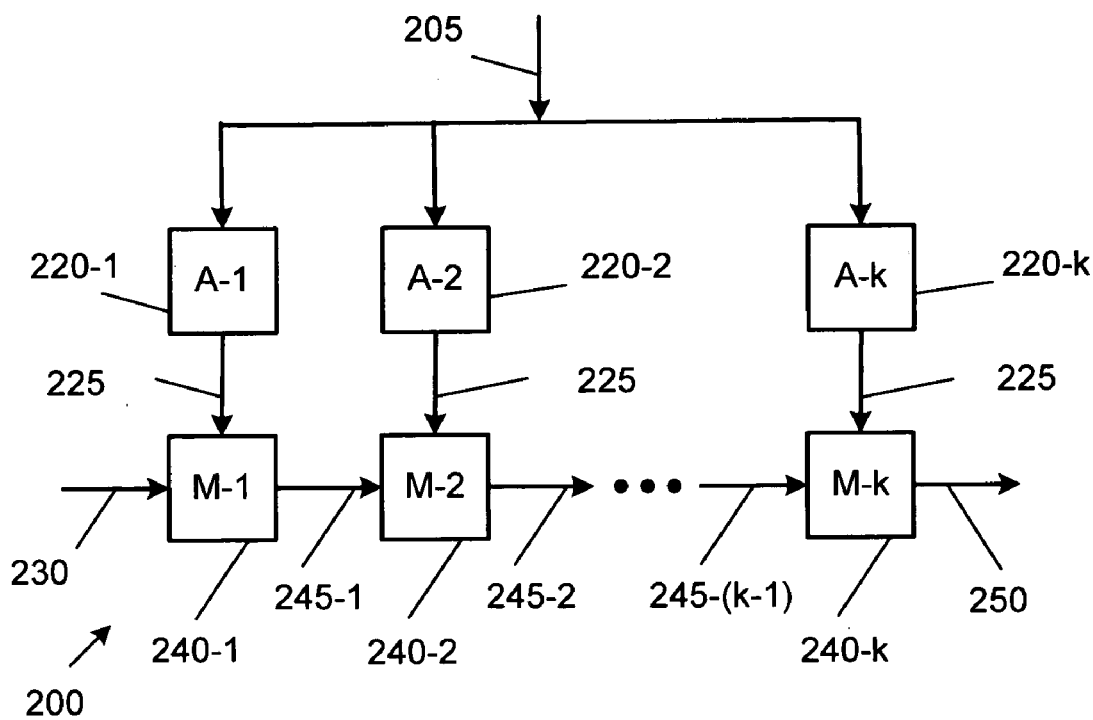
FIG. 2 is a block diagram of an integrated distributed amplifier optical modulator, according to one embodiment of the present invention.

FIG. 2 is a block diagram of an integrated distributed amplifier (DA) optical modulator 200, according to one embodiment of the present invention. DA modulator 200 is made of distributed amplifiers 220-1 to 220-$k$ (A-1 to A-k) and series connected k modulating elements 240-1 to 240-$k$ (M-1 to M-k). The modulating elements can be PN or other types of modulators. Each of the distributed amplifiers 220-1 to 220-$k$ receives modulating signal 205 on its input port and has k output ports 225-1 to 225-$k$. The outputs 225-1 to 225-$k$ of amplifiers 220-1 to 220-$k$ are connected in parallel to the modulating input terminal of the respective k optical modulating elements 240-1 to 240-$k$ connected in series.

Optical carrier 230 is connected to the carrier input of the first modulating element 240-1. The modulated output 250 of the series of modulating elements is at the end of the chain of modulators. Optical wave 230 is modulated by electrical signal 225 in each of the modulating elements 240-1 to 240-$k$ (M-1 to M-k). Each successive modulating element in the series can provide additional modulation. This process continues through the k stages of modulation, until the fully modulated output 250 of the last modulating element 240-$k$ (M-k) is generated.

Distributed amplifiers 220-1 to 220-$k$ provide many advantages compared to the prior art TW modulator shown in FIG. 1, such as impedance matching between the outputs of the distributed amplifiers 220-1 to 220-$k$ and the k modulating elements, adjustable gain control and automatic gain control. The output impedance of any output port 225-$j$ of distributed amplifier 220-$j$ can match the input impedance of the corresponding modulating signal input port of modulating element 240-$j$.

Electrical signal 225, amplified from modulating input signal 205, is used to modulate the optical wave propagating through the series of modulating elements 240-1 to 240-$k$. For signal 225 to effectively modulate optical wave 230 in modulator 200, the time delay between the first 240-1 and last 240-$k$ modulating elements should be as short as possible.

Figure 3:
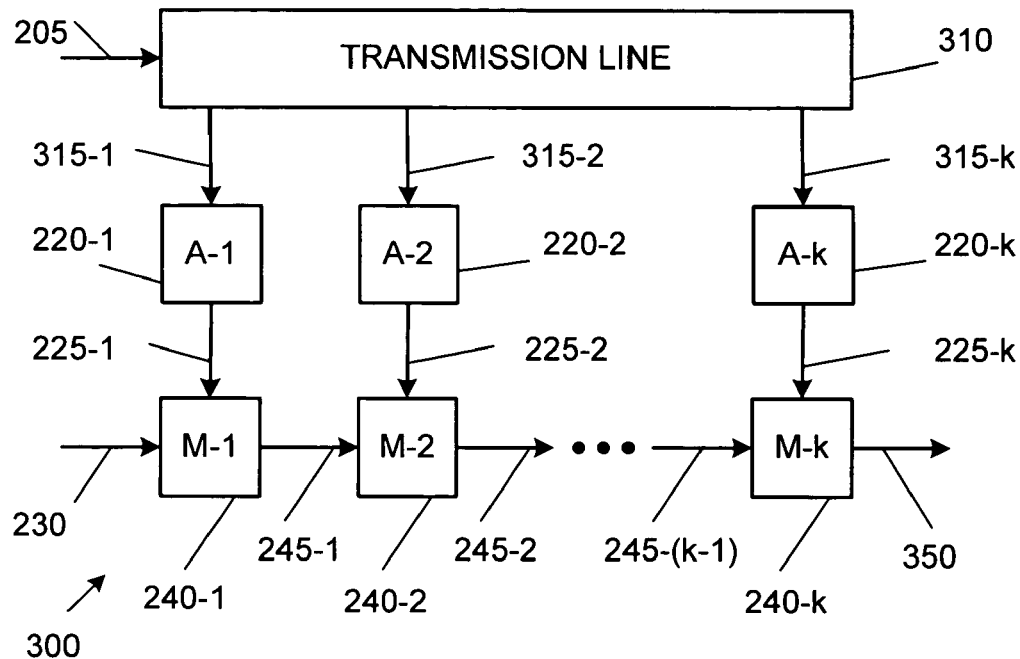
FIG. 3 is a block diagram of an integrated distributed amplifier optical modulator, according to an alternate embodiment of the present invention.

FIG. 3 is a block diagram of an integrated distributed amplifier (DA) optical modulator 300, according to one embodiment of the present invention. DA modulator 300 is made of transmission line (TL) 310, distributed amplifiers 220-1 to 220-$k$ (A-1 to A-k) and series connected k modulating elements 240-1 to 240-$k$ (M-1 to M-k). TW 310 receives modulating signal 205 on its input port and has k output ports 315-1 to 315-$k$. Each of the outputs 315-$j$ is delayed relative to the previous output 315-$j$-1, depending on the length of the transmission line between any two adjacent output ports. Each of the k outputs of the TL is connected to the respective inputs of amplifiers 220-1 to 220-$k$. The outputs 225-1 to 225-$k$ of amplifiers 220-1 to 220-$k$ are connected to the modulating input terminal of the respective k optical modulating elements 240-1 to 240-$k$ connected in series.

Transmission line 310 can also be made of several shorter transmission lines connected in series, and the output of each shorter transmission line can be connected to a buffer. The output of each buffer can be connected to the input of the next transmission line and to the input of the respective distributed amplifier. The buffers can stabilize the amplitude of the signal in the transmission line and the amplitude of the signals connected to the distributed amplifiers.

Optical carrier 230 is connected to the carrier input of the first modulating element 240-1. The modulated output 350 is generated at the end of the series of modulating elements, at the output of modulating element 240-$k$. Optical wave 230 is first modulated by electrical signal 315-1 from transmission line 310 in modulating element (240-1. Output 245-1 of modulating element 240-1 is connected to the input of modulating element 240-2, where the optical wave is further modulated by electrical signal 315-2 from TL 310. Each successive modulating element in the series can provide additional modulation. This process continues through the k stages of modulation, until the fully modulated output 350 of the last modulating element 240-$k$ is generated.

Distributed amplifiers 220-1 to 220-$k$ provide many advantages compared to the prior art TW modulator shown in FIG. 1, such as impedance matching between the outputs of the TL and the k modulating elements, adjustable gain control and automatic gain control. The input impedance of any input port of distributed amplifier 220-$j$ can be designed to be equal or higher than the output impedance of the corresponding output port 315-$j$ of TL 310. The output impedance of any output port 225-$j$ of distributed amplifier 220-$j$ can match the input impedance of the corresponding modulating input port of modulating element 240-$j$.

Since an electrical signal propagating in TL 310 will be attenuated as it travels through TL 310, each of the amplifiers 220-1 to 220-$k$ can have an adjustable gain control to compensate for the attenuation and thus provide the same amplitude signal to each of the modulating elements 240-1 to 240-$k$. Another way to compensate for attenuation in TL 310, is to provide each of the amplifiers 220-1 to 220-$k$ with an automatic gain control (AGC) to stabilize the output amplitude of the amplifiers.

Figure 4:
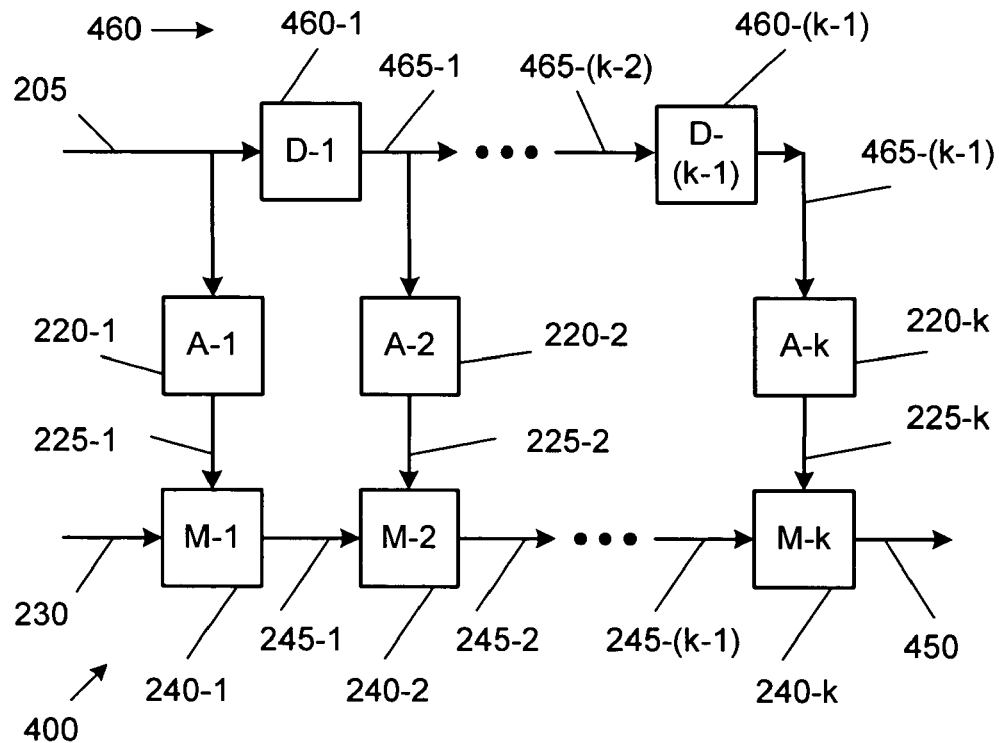
FIG. 4 is a block diagram of an integrated distributed amplifier optical modulator, according to another embodiment of the present invention.

FIG. 4 is a block diagram of an integrated distributed amplifier optical modulator, according to an alternate embodiment of the present invention. The DA modulator 400 of FIG. 4 is very similar to the DA modulator 200 of FIG. 3, except that multi-tap delay line 460 is used instead of transmission line 310. TL 310 of FIG. 3 can be understood as a type of multi-tap delay line. Delay line 460 is made of series connected delay elements 460-1 to 460-($k$–1) [D-1 to D-(k–1)]. The output 465-$j$ of any delay 460-$j$ is connected to the next delay 460-($j$+1) and to the input of amplifier 240-($j$+1). The other similarly numbered elements of FIG. 4 provide the same functions as previously discussed with respect to FIG. 3.

The output of each delay element 460-$j$ can be stabilized by connecting a suitable buffer to the output and then connecting the output of the buffer to the next delay element 460-($j$+1) and respective amplifier 220-($j$+1). The delay elements can be made of any of a variety of delay elements, such as transmission lines and transistor based devices. The delay lines can also include electronically controlled variable delay lines.

The DA modulators of FIGS. 2, 3 and 4 can be any of a variety of electroabsorptive modulators, such as phase modulators, forward and reverse biased PN modulators and MOS capacitor modulators.

More information about PN modulators can be found in the following U.S. patent applications, which are incorporated herein by reference: Ser. No. 10/917,204 "PN Diode Optical Modulators Fabricated In Rib Waveguides," Ser. No. 10/916,839 "PN Diode Optical Modulators Fabricated In Strip Loaded Waveguides," Ser. No. 10/917,430 "PN Diode Optical Modulators With Variegated PN Junctions" and Ser. No. 10/916,857 "Doping Profiles In PN Diode Optical Modulators," filed on Aug. 11, 2004.

Any of the DA modulators of the present invention can be fabricated on a variety of substrates or wafers, such as: a layer of monocrystalline silicon, silicon on insulator (SOI), a layer of sapphire, an air filled cavity and a five layer substrate of three layers of monocrystalline silicon with two layers of dielectric between them. It is also possible to use gallium arsenide or indium phosphide substrates or wafers to construct DA modulators of the present invention.

One advantage of fabricating distributed amplifier modulators of the present invention on a silicon or SOI substrate, is the ability to use low cost and well developed CMOS processes for the fabrication of the optical, optoelectronic and electronic devices on the same substrate or wafer. If a distributed amplifier modulator is fabricated on a silicon or SOI substrate, then silicon optoelectronic elements such as the modulating elements can be formed at the same time and of the same silicon used to form the silicon body of a transistor, such as a CMOS transistor.

Figure 5:
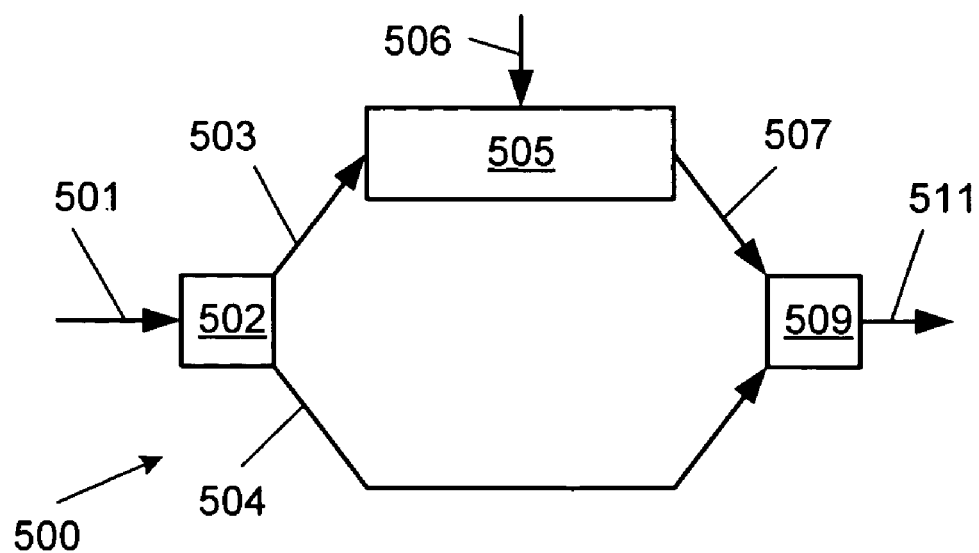
FIG. 5 is an overall block diagram of a Mach-Zehnder Interferometer, incorporating one of the optical modulators of the present invention.

FIG. 5 is an overall block diagram of an example of a Mach-Zehnder Interferometer (MZI) 500, incorporating any one of the DA modulators of the present invention. Optical wave 501 of fixed frequency and amplitude is input to splitter 502, which divides optical wave 501 into two optical waves 503 and 504 of equal amplitude propagating through the two arms of MZI 500. Optical wave 503 is input to DA modulator 505, which can cause a phase shift in optical wave 503 and produce optical wave 507 as a result of applied electrical voltage 506. Modulated wave 507 and unmodulated wave 504 are summed in combiner 509 to generate output 511. Depending on the phase relationship between the two waves 507 and 504, combining the two waves can cause constructive or destructive interference, which can result in intensity modulated wave 511. Modulation of optical wave 501 is produced by an electrically controlled phase shift in DA modulator 505.

MZI 500 is one of many well known devices or systems which can be used to modulate an optical wave. Other types of optical modulating systems, which can use any one of the DA modulators of the present invention, include but are not limited to: an WZI modulator with a DA modulator in both arms of the MZI as shown in FIG. 6, a ring modulator consisting of a waveguide coupled to a ring resonator, where the ring resonator contains a DA modulator, a Fabry-Perot (FP) cavity where the DA phase modulator is part of the FP cavity, and an MZI modulator where either one or each of its arms contains one or more of the above ring modulators or FP modulators having a DA modulator.

Figure 6:
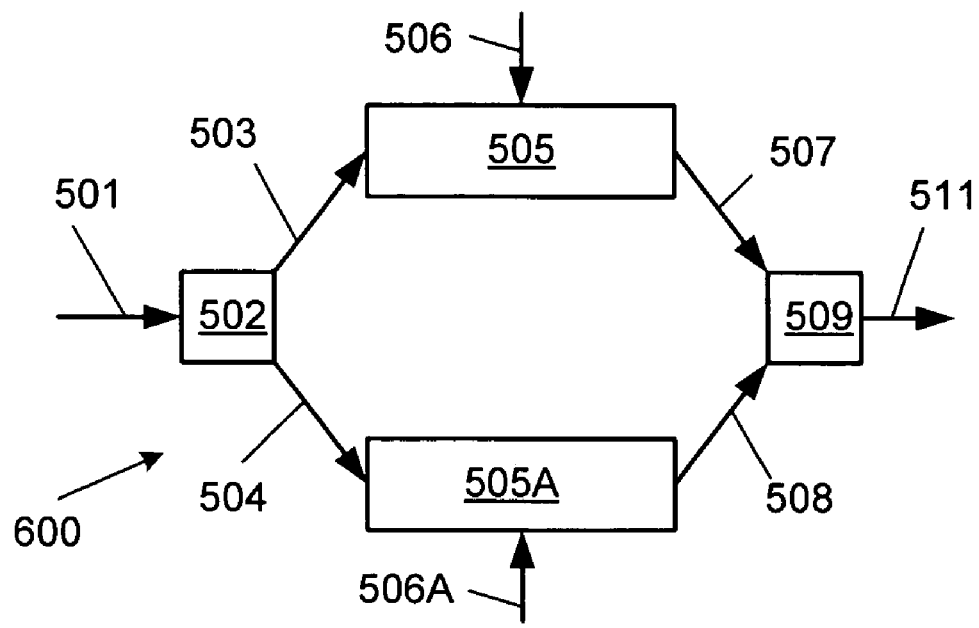
FIG. 6 is an overall block diagram of a Mach-Zehnder Interferometer, incorporating two of the optical modulators of the present invention.

FIG. 6 is an overall block diagram of an example of a Mach-Zehnder Interferometer (MZI) 500, incorporating any two identical DA modulators of the present invention. Optical wave 501 of fixed frequency and amplitude is input to splitter 502, which divides optical wave 501 into two optical waves 503 and 504 of equal amplitude propagating through the two arms of MZI 500.

Optical wave 503 is input to DA modulator 505, which can cause a phase shift in optical wave 503 and produce optical wave 507 as a result of applied electrical signal 506. Optical wave 504 is input to DA modulator 505A, which can cause an opposite phase shift in optical wave 504 and produce optical wave 508 as a result of applied electrical voltage 506A. Applied signal 506A is the inverse of modulating signal 506. MZI modulator 600 uses signals 506 and 506A as a differential modulating signal, which can result in the cancellation of noise, which may be present in the modulating signal 506.

Modulated wave 507 and modulated wave 508 are summed in combiner 509 to generate output 511. Depending on the phase relationship between the two waves 507 and 508, combining the two waves can cause constructive or destructive interference, which can result in intensity modulated wave 511. Modulation of optical wave 501 is produced by the electrically controlled phase shifts in DA modulators 505 and 505A.

Figure 7:
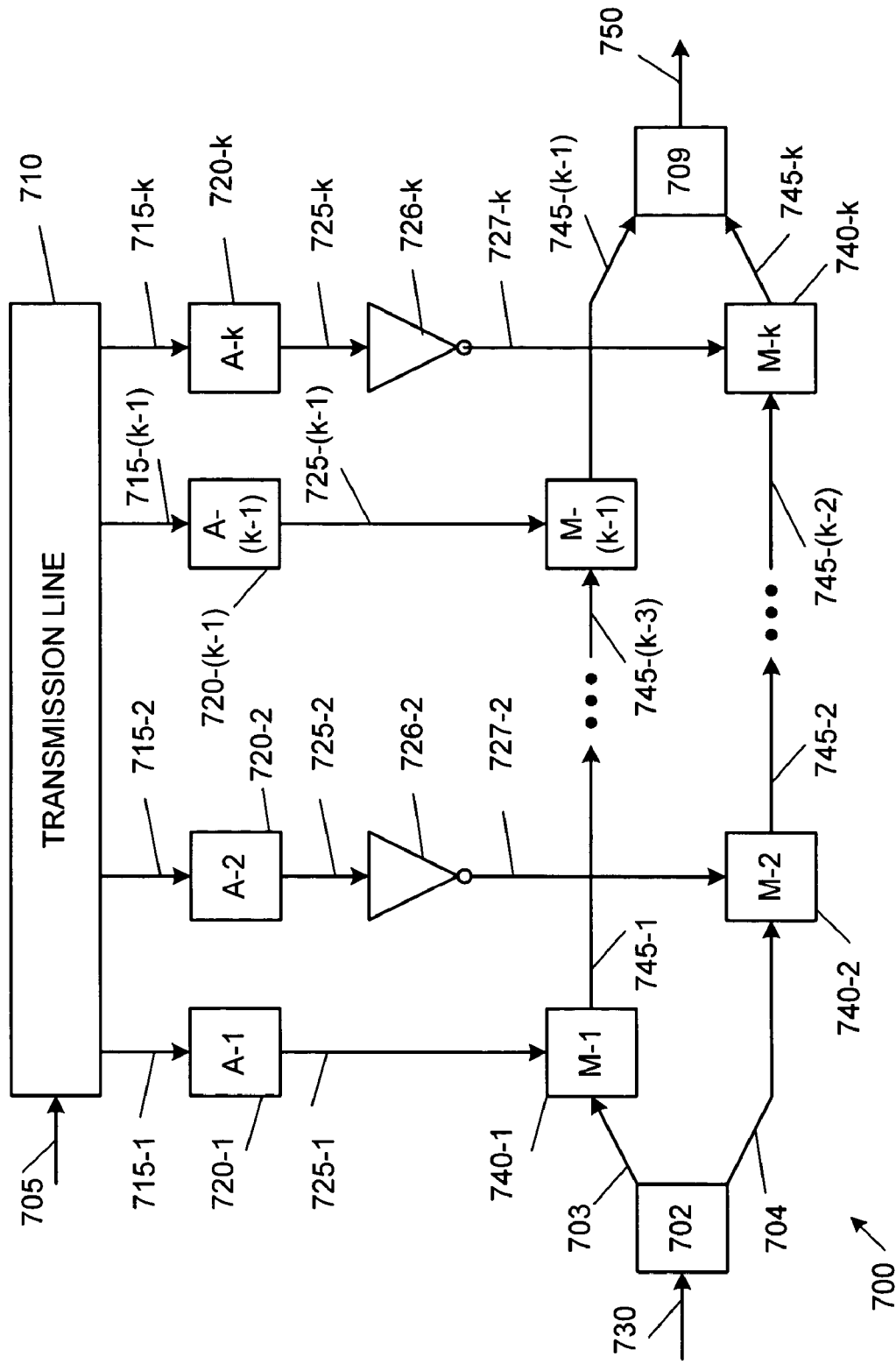
FIG. 7 is an overall block diagram of a Mach-Zehnder Interferometer, incorporating one of the optical modulators of the present invention.

FIG. 7 is an overall block diagram of a Mach-Zehnder Interferometer, incorporating one of the distributed amplifier optical modulators of the present invention. MZI modulator 700 is made of optical splitter 702, transmission line (TL) 710, distributed amplifiers 720-1 to 720-$k$ (A-i to A-k), series connected k modulating elements 740-1 to 740-$k$ (M-1 to M-k) and optical combiner 709.

Optical wave 730 of fixed frequency and amplitude is input to splitter 702, which divides optical wave 730 into two optical waves 703 and 704 of equal amplitude propagating through the two arms of MZI 700. Optical wave 703 is input to the half of the modulating elements that are in the upper arm of MZI modulator 700, which can cause a phase shift in optical wave 703 and produce optical wave 745-($k$–1) as a result of the applied electrical signals. Optical wave 704 is input to the half of the modulating elements that are in the lower arm of MZI modulator 700, which can cause a phase shift in optical wave 704 and produce optical wave 745-$k$ as a result of the applied electrical signals.

Modulated wave 745-($k$–1) and modulated wave 745-$k$ are summed in combiner 709 to generate output 750. Depending on the phase relationship between the two waves 745-($k$–1) and 745-$k$, combining the two waves can cause constructive or destructive interference, which can result in intensity modulated wave 750. Modulation of optical wave 730 is produced by the electrically controlled phase shifts in MZI modulator 700.

TL 710 receives modulating signal 705 on its input port and has k output ports 715-1 to 715-$k$. Each of the outputs 715-$j$ is delayed relative to the previous output 715-($j$–1), depending on the length of the transmission line between any two adjacent output ports. Each of the k outputs of the TL is connected to the respective inputs of amplifiers 720-1 to 720-$k$.

The odd numbered outputs 725-1 to 725-($k$–1) of amplifiers 720-1 to 720-($k$–1) are connected to the modulating input terminal of the respective k/2 optical modulating elements 740-1 to 740-($k$–1) connected in series in the upper arm of MZI modulator 700.

The even numbered outputs 725-2 to 725-$k$ of amplifiers 720-2 to 720-$k$ are connected to the respective inputs of signal inverters 726-2 to 726-$k$. The outputs 727-2 to 727-$k$ of respective signal inverters 726-2 to 726-$k$ are connected to the respective inputs of modulating elements 740-2 to 740-$k$ in the lower arm of MZI modulator 700.

MZI modulator 700 uses the odd numbered ports and the even numbered ports of TL 710 as a differential modulating signal, which can result in the cancellation of noise, which may be present in the modulating signal 705. To provide for the same amount of modulation in the upper and lower arms of MZI 700, the number of modulating elements in the upper and lower arms should be equal, so that k, the total number of modulating elements, should be an even number.

Distributed amplifiers 720-1 to 720-k provide many advantages such as impedance matching between the outputs of the TL and the k modulating elements, adjustable gain control and automatic gain control.

Although the present invention has been described in detail, it should be understood that various changes, substitutions and alterations can be made without departing from the spirit and scope of the invention.

We claim:

1. An integrated optoelectronic device on a monolithic substrate comprising:
   a plurality of optical modulating elements coupled in series,
   where the plurality of optical modulating elements has an optical input port and an optical output port,
   each of the plurality of optical modulating elements has an electrical input port for modulating the propagation properties of a guided optical wave propagating in a respective one of the plurality of optical modulating elements, and
   at least one of the plurality of optical modulating elements comprises a two terminal silicon PN diode wherein a depletion region can be varied according to a bias voltage for varying a refractive index; wherein the refractive index variation modulates the propagation properties of the guided optical wave;
   and a plurality of amplifiers,
   where each of the plurality of amplifiers has an input port, an output port and each output port is coupled to the electrical input port of a respective one of the plurality of optical modulating elements.

2. The optoelectronic device of claim 1, and further comprising a multi-tap delay line comprised of a plurality of electrical delay elements coupled in series,
   where the multi-tap delay line has an input port and a plurality of output ports,
   each of the plurality of output ports comprises the output of a respective one of the plurality of delay elements, and
   each one of the output ports is coupled to a respective one of the input ports of the plurality of amplifiers.

3. The optoelectronic device of claim 2, wherein the plurality of delay lines comprises a microwave transmission line with an input port and a plurality of output ports.

4. The optoelectronic device of claim 3, wherein the output impedance of each of the plurality of output ports of the transmission line is substantially equal to the input impedance of each respective input port of the plurality of amplifiers.

5. The optoelectronic device of claim 1, wherein the output impedance of each of the plurality of output ports of the plurality of amplifiers is substantially equal to the input impedance of each respective input port of the plurality of optical modulators.

6. An optoelectronic device on a substrate comprising:
   a plurality of optical modulating elements coupled in series,
   where the plurality of optical modulating elements has an optical input port and an optical output port; and
   each of the plurality of optical modulating elements has an electrical input port for modulating the propagation properties of a guided optical wave propagating in a respective one of the plurality of optical modulating elements;
   a plurality of amplifiers,
   where each of the plurality of amplifiers has an input port, an output port and each output port is coupled to the electrical input port of a respective one of the plurality of optical modulating elements; and
   a multi-tap delay line comprised of a plurality of electrical delay elements coupled in series;
   where the multi-tap delay line has an input port and a plurality of output ports;
   each of the plurality of output ports comprises the output of a respective one of the plurality of delay elements; and
   each one of the output ports is coupled to a respective one of the input ports of the plurality of amplifiers;
   wherein the plurality of delay lines are transistor based.

7. The optoelectronic device of claim 6, wherein at least one of the plurality of delay lines comprises an electronically controlled variable delay line.

8. An optoelectronic device on a substrate comprising:
   a plurality of optical modulating elements coupled in series,
   where the plurality of optical modulating elements has an optical input port and an optical output port; and
   each of the plurality of optical modulating elements has an electrical input port for modulating the propagation properties of a guided optical wave propagating in a respective one of the plurality of optical modulating elements;
   a plurality of amplifiers,
   where each of the plurality of amplifiers has an input port, an output port and each output port is coupled to the electrical input port of a respective one of the plurality of optical modulating elements;
   a multi-tap delay line comprised of a plurality of electrical delay elements coupled in series;
   where the multi-tap delay line has an input port and a plurality of output ports;
   where each of the plurality of output ports comprises the output of a respective one of the plurality of delay elements;
   where each one of the output ports is coupled to a respective one of the input ports of the plurality of amplifiers; and
   a plurality of buffer circuits;
   wherein the output of at least one of the plurality of delay lines is coupled to the input of a respective buffer circuit and the output of the buffer circuit is coupled to at least one other of the plurality of delay lines, and the output of the buffer circuit is coupled to a respective one of the input ports of the plurality of amplifiers.

9. The optoelectronic device of claim 2, wherein the electrical propagation velocity in the plurality of delay lines is substantially equal to the optical propagation velocity in the plurality of optical modulators.

10. The optoelectronic device of claim 2, wherein a signal propagating in the plurality of delay lines is attenuated as it propagates through the plurality of delay lines,
    where the amplitude of a signal at a selected one of the plurality of output ports of the plurality of delay lines is attenuated relative to the amplitude of an input signal coupled to the input port of the plurality of delay lines.

11. The optoelectronic device of claim 1, wherein each of the plurality of amplifiers has an adjustable gain, where the gain of each of the plurality of amplifiers is adjusted to provide a signal of substantially the same amplitude at the output port of each of the plurality of amplifiers.

12. The optoelectronic device of claim 1, wherein each of the plurality of amplifiers has an automatic gain control, where the automatic gain control of each of the plurality of amplifiers is used to provide a signal of substantially the same amplitude at the output port of each of the plurality of amplifiers.

13. The optoelectronic device of claim 1, wherein each of the plurality of optical modulators is selected from a group consisting of: an electroabsorptive modulator, a phase modulator, a PN modulator.

14. The optoelectronic device of claim 2, and further comprising using the optoelectronic device in an optical processing system.

15. The optoelectronic device of claim 14, wherein the optical processing system is selected from a group comprising: an arrayed waveguide grating (AWG), an optical switch, a laser cavity, a ring resonator based add/drop filter, a Fabry-Perot (FP) cavity based add/drop filter, an MZI based filter, a ring resonator based filter, FP cavity based filter, a periodically perturbed waveguide, a corrugated waveguide, a multi-mode-interference (MMI) splitter/combiner, Y-junction and directional coupler.

16. The optoelectronic device of claim 2, and further comprising using the optoelectronic device in an integrated optical modulation system selected from a group comprising: a Mach-Zehnder Interferometer, a ring modulator and a Fabry-Perot cavity.

17. An optoelectronic device on a substrate comprising:
a plurality of optical modulating elements coupled in series,
where the plurality of optical modulating elements has an optical input port and an optical output port; and each of the plurality of optical modulating elements has an electrical input port for modulating the propagation properties of a guided optical wave propagating in a respective one of the plurality of optical modulating elements;
a plurality of amplifiers,
where each of the plurality of amplifiers has an input port, an output port and each output port is coupled to the electrical input port of a respective one of the plurality of optical modulating elements;
a multi-tap delay line comprised of a plurality of electrical delay elements coupled in series;
where the multi-tap delay line has an input port and a plurality of output ports;
where each of the plurality of output ports comprises the output of a respective one of the plurality of delay elements;
where each one of the output ports is coupled to a respective one of the input ports of the plurality of amplifiers; and
an optical splitter and an optical combiner,
where the odd numbered modulating elements of the plurality of modulating elements are coupled in a first series with an optical input port and an optical output port,
the even numbered modulating elements of the plurality of modulating elements are coupled in a second series with an optical input port and an optical output port,
the optical splitter has an input port and first and second output ports,
the optical combiner has first and second input ports and an output port,
the first output port of the optical splitter is coupled to the optical input port of the first series,
the second output port of the optical splitter is coupled to the optical input port of the second series,
the optical output port of the first series is coupled to the first input port of the optical combiner, and
the optical output port of the second series is coupled to the second input port of the optical combiner.

18. The optoelectronic device of claim 2, wherein the optoelectronic device is disposed on a substrate selected from a group consisting of:
a layer of monocrystalline silicon,
silicon on insulator (SOI),
a layer of sapphire,
an air filled cavity,
wherein the two terminal silicon PN diode comprises a periodical distributed lateral abrupt PN diode structure.

19. The optoelectronic device of claim 18, wherein silicon used to form at least one component of the plurality of modulating elements and the silicon body of a transistor are formed at the same time from the same silicon.

20. The optoelectronic device of claim 1, wherein at least one of the input ports of the plurality of amplifiers is coupled to a device formed on the substrate and where the device is selected from the group comprising: a CMOS transistor, a BiCMOS transistor, a bipolar junction transistor (BJT), a junction PET (JFET) transistor, a diode, a resistor, a capacitor and an inductor.

21. The optoelectronic device of claim 2, wherein the optoelectronic device is disposed on a substrate selected from a group consisting of:
a layer of monocrystalline silicon,
silicon on insulator (SOI),
a layer of sapphire, and
an air filled cavity,
wherein the two terminal silicon PN diode comprises a first and second doped regions and a first and second electrical contacts formed in the respective first and second doped regions;
wherein the highest concentration of dopant within each of the respective first and second doped regions is substantially adjacent to the first and second electrical contacts;
wherein the lowest concentration of dopant within each of the respective first and second doped regions is substantially in the center of the guided optical wave propagating in a respective one of the plurality of optical modulating elements.

22. An integrated optoelectronic device on a monolithic substrate comprising:
a plurality of optical modulating elements coupled in series,
where the plurality of optical modulating elements has an optical input port and an optical output port; and each of the plurality of optical modulating elements has an electrical input port for modulating the propagation properties of a guided optical wave propagating in a respective one of the plurality of optical modulating elements;
a plurality of amplifiers,
where each of the plurality of amplifiers has an input port, an output port and each output port is coupled to the electrical input port of a respective one of the plurality of optical modulating elements;
wherein at least one of the plurality of the optical modulating elements comprises a MOS capacitor.

23. An integrated optoelectronic device on a monolithic substrate comprising:
a plurality of optical modulating elements coupled in series,
where the plurality of optical modulating elements has an optical input port and an optical output port; and
each of the plurality of optical modulating elements has an electrical input port for modulating the propagation properties of a guided optical wave propagating in a respective one of the plurality of optical modulating elements;
a plurality of amplifiers,
where each of the plurality of amplifiers has an input port, an output port and each output port is coupled to the electrical input port of a respective one of the plurality of optical modulating elements;
wherein at least one of the plurality of optical modulating elements comprises a PIN diode;
wherein at least one of the plurality of amplifiers comprises a current push-pull driver circuit.

24. An integrated optoelectronic device on a monolithic substrate comprising:
a plurality of optical modulating elements coupled in series,
where the plurality of optical modulating elements has an optical input port and an optical output port, and
each of the plurality of optical modulating elements has an electrical input port for modulating the propagation properties of a guided optical wave propagating in a respective one of the plurality of optical modulating elements,
and a plurality of amplifiers,
where each of the plurality of amplifiers has an input port, an output port and each output port is coupled to the electrical input port of a respective one of the plurality of optical modulating elements;
wherein the monolithic substrate comprises:
a first layer comprised of monocrystalline silicon,
a second layer comprised of dielectric material disposed on the first layer,
a third layer comprised of monocrystalline silicon disposed on the second layer,
a fourth layer comprised of dielectric material disposed on the third layer, and
a fifth layer comprised of monocrystalline silicon disposed on the fourth layer.

* * * * *